US007088049B2

(12) United States Patent
Takeuchi et al.

(10) Patent No.: US 7,088,049 B2
(45) Date of Patent: Aug. 8, 2006

(54) ELECTRON-EMITTING DEVICE AND FIELD EMISSION DISPLAY USING THE SAME

(75) Inventors: Yukihisa Takeuchi, Nishikamo-gun (JP); Tsutomu Nanataki, Toyoake (JP); Iwao Ohwada, Nagoya (JP); Tomoya Horiuchi, Nishikasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/027,232

(22) Filed: Dec. 20, 2001

(65) Prior Publication Data

US 2002/0153827 A1 Oct. 24, 2002

(30) Foreign Application Priority Data

Dec. 22, 2000 (JP) ....................................... 2000-390299

(51) Int. Cl.
*G09G 3/10* (2006.01)
*H01L 41/04* (2006.01)

(52) U.S. Cl. ..................................... 315/169.1; 310/321

(58) Field of Classification Search .............. 315/169.1, 315/169.3; 313/104, 495, 496, 497, 542, 313/543
See application file for complete search history.

(56) References Cited

U.S. PATENT DOCUMENTS 5,818,166 A * 10/1998 Karpov et al. .............. 313/495
5,831,387 A 11/1998 Kaneko et al. ............. 313/495
6,100,628 A * 8/2000 Coll et al. .................. 313/310
6,396,193 B1 * 5/2002 Takeuchi et al. ............ 310/321
6,420,825 B1 * 7/2002 Shinjo et al. ............... 313/495
6,426,590 B1 * 7/2002 Chung et al. ............... 313/496
6,445,122 B1 * 9/2002 Chuang et al. ............. 313/495
6,452,309 B1 * 9/2002 Takeuchi et al. ............ 310/331
6,476,336 B1 * 11/2002 Takeuchi et al. ............ 200/181
6,545,421 B1 * 4/2003 Takeuchi et al. ......... 315/169.1

FOREIGN PATENT DOCUMENTS

EP 0 767 481 4/1997
EP 1 073 090 1/2001
EP 1 265 263 12/2002

(Continued)

OTHER PUBLICATIONS

*Electron Emission from Ferroelectric Cathodes Excited by Pulsed Voltage*, Masatoshi Miyake et al. (Tokyo Institute of Technology), T. IEE Japan, vol. 119-A, No. 5, '99, pp. 622-627.

(Continued)

*Primary Examiner*—Don Wong
*Assistant Examiner*—Minh Dieu A
(74) *Attorney, Agent, or Firm*—Burr & Brown

(57) ABSTRACT

An electron-emitting element includes an electric field applying portion comprising of a dielectric formed on a substrate, a first electrode formed on one surface of the electric field applying portion, a second electrode being formed on the surface of the electric filed applying portion, and a slit formed in cooperation with the first electrode.

31 Claims, 16 Drawing Sheets

FOREIGN PATENT DOCUMENTS

| | | |
|---|---|---|
| FR | 2 789 221 | 8/2000 |
| JP | 44-26125 | 11/1969 |
| JP | 46-20944 | 6/1971 |
| JP | 1-311533 | 12/1989 |
| JP | 7-147131 | 6/1995 |
| JP | 08-264105 | 10/1996 |
| JP | 09-27273 | 1/1997 |
| JP | 09-045226 | 2/1997 |
| JP | 09-090882 | 4/1997 |
| JP | 10-040806 | 2/1998 |
| JP | 11-317149 | 11/1999 |
| JP | 2000-285801 | 10/2000 |

OTHER PUBLICATIONS

*Pulsed electron source using a ferroelectric cathode*, Kiochi Yasuoka et al. (Tokyo Institute of Technology), vol. 68, No. 5, '99, pp. 546–550.

*On the mechanism of emission from the ferroelectric ceramic cathode*, Victor F. Puchkarev et al., J. App. Phys. 78 (9), Nov. 1, 1995, pp. 5633–5637.

*Electron emission from ferroelectrics—a review*, H. Riege, Nuclear Insruments and Methods in Physics Research, A340(1994), pp. 80–89.

Jun–Ichi Asno et al: "Electron Emission Into vacuum from PZT Ferroelectric Ceramics Induced by Polarization Reversal" Extended Abstracts of the International Conference on Solid State Devices and Materials, Japan Society of Applied Physics, Tokyo, JA, Aug. 1, 1992, pp. 466–468, XP000312255.

* cited by examiner

ELECTRON-EMITTING DEVICE AND FIELD EMISSION DISPLAY USING THE SAME

TECHNICAL FIELD

The present invention relates to an electron-emitting element and a field emission display using the same.

BACKGROUND ART

Such an electron-emitting element has a driving electrode and an earth electrode, and is applied to various applications such as an field emission display (FED) and back light. In case of applying to an FED, a plurality of electron-emitting elements are two dimensionally arranged in two dimensions and a plurality of phosphors being opposite to these electron-emitting elements are arranged at a certain space to each other.

However, since a conventional electron-emitting element is not good in straight advancing ability, namely, in the degree of the straight advancement of electron emitted from the electron-emitting element to specified objects (phosphors for example), and in order to hold a desired current density by emitted electrons, it is necessary to apply a comparatively high voltage to the electron-emitting element.

And in case of applying the conventional electron-emitting element to the FED, since straight advancing ability of the conventional electron-emitting element is not good, the crosstalk is relatively large, namely, there is a high probability that an emitted electron strikes on a phosphor adjacent to a targeted phosphor. As a result, it is difficult to make the pitch between the phosphors narrow and it is necessary to provide a grid in order to prevent an electron from hitting on an adjacent phosphor.

It is an object of the present invention is to provide an electron-emitting element having a good straight advancing ability of emitted electrons and a field emission display using the same.

It is another object of the present invention is to provide an electron-emitting element realizing an electron emission with a high current density at a comparatively low vacuum and a remarkable low driving voltage and a field emission display using the same.

SUMMARY OF THE INVENTION

There is provided an electron-emitting element comprising an electric field applying portion composed of a dielectric, a first electrode formed on one surface of this electric field applying portion, a second electrode formed on the one surface of the electric field applying portion and forming a slit in cooperation with the first electrode.

According to the present invention, electrons are emitted from the electric field applying portion by applying a pulse voltage to the first or second electrode. By composing the electric field applying portion by the dielectric, it is possible to obtain a good straight advancing ability that cannot be achieved by the conventional electron-emitting element. As a result, a voltage to be applied to the electron-emitting element needed to hold a desired current density is remarkably lower than that of the conventional electron-emitting element, and the energy consumption is greatly reduced. Since the first and second electrodes can be formed on the electric field applying portion by means of a thick film printing method, the electron-emitting element according to the present invention is preferable from the viewpoint of durability and cost reduction.

In order to reduce the voltage to be applied to the electron-emitting element furthermore, it is preferable to apply a carbon coating to the first and second electrodes and the slit. In this case, by the application of the carbon coating, there is remarkable reduction of the probability to damage the first and second electrodes caused by collision between electrons and ions or by generation of heat.

In order to perform a good electron emission, it is preferable to further comprise a third electrode arranged at a certain space to the first and second electrodes, and to make the space between the first and second electrodes and the third electrode vacuum.

There is provided another electron-emitting element comprising:

- an electric field applying portion composed of at least one of a piezoelectric material, an electrostrictive material and an antiferroelectric material;
- a first electrode formed on one surface of this electric field applying portion; and
- a second electrode formed on the one surface of the electric field applying portion, and forming a slit in cooperation with the first electrode.

According to the present invention, not only a good straight advancing ability can be obtained, but also the electric field applying portion acts as an actuator and is bent and displaced when a pulse voltage is applied to the first or second electrode. As a result, the straight advancing ability of the electron-emitting element is more improved.

In order to reduce the voltage to be applied to the electron-emitting element further more, it is preferable to apply the carbon coating to the first and second electrodes and the slit. In this case, by the application of the carbon coating, there is remarkable reduction of the probability to damage the first and second electrodes caused by collision between electrons and ions or by generation of heat.

In this case, also, in order to perform a good electron emission, it is preferable to further comprise a third electrode being arranged at a certain space to the first and second electrodes and to make the space between the first and second electrodes and the third electrode vacuum. At this time, the electric field applying portion also acts as the actuator, and makes it possible to control the amount of emitted electrons by the displacement motion of the electric field applying portion.

Preferably, the electron-emitting element further has a voltage source for applying a direct offset voltage to the third electrode, and a resistor arranged in series between the voltage source and the third electrode. Thereby, a desired current density can be easily achieved, and short-circuit between the third electrode and the first and second electrodes is prevented.

For example, a pulse voltage is applied to the first electrode, and a direct offset voltage is applied to the second electrode.

Preferably, the electron-emitting element further has a capacitor arranged in series between the first electrode and a voltage signal source. Thereby, a voltage can be applied between the first electrode and the second electrode only until the capacitor is charged up, and as a result, the breakage caused by the short-circuit between the first and second electrodes is prevented.

In case of further having a fourth electrode being formed on the other surface of the electric field applying portion and opposite to the first electrode, since the electric field applying portion between the first electrode and the third electrode acts as a capacitor, the breakage caused by the short-circuit between the first and second electrodes is prevented. In this case, for example, a pulse voltage is applied to the fourth electrode and a direct offset voltage is applied to the second electrode.

It may further have a resistor arranged in series between the second electrode and the direct offset voltage source. In this case, a current to be flowed by discharging from the first electrode to the second electrode is suppressed by the resistor, and breakage to be caused by short-circuit between the first and second electrodes is prevented.

In order to achieve a sharp reduction of the voltage to be applied, it is preferable to have the relative dielectric constant of the electric field applying portion not less than 1000 and/or the width of said slit not more than 500 μm.

In order to perform a good electron emission, it is preferable for at least one of the first and second electrodes to have an angular part with an acute angle and/or for the first electrode and the second electrode to have carbon nanotubes.

There is provided a field emission display comprising:

- a plurality of electron-emitting elements arranged in two dimensions; and
- a plurality of phosphors being arranged at a certain space to each of these electron-emitting elements, each of said electron-emitting elements having:
  - an electric field applying portion composed of a dielectric;
  - a first electrode formed on one surface of this electric field applying portion; and
  - a second electrode formed on the surface of the electric field applying portion, and forming a slit in cooperation with the first electrode.

Since a field emission display according to the present invention is excellent in the straight advancing ability of the electron-emitting element, it is smaller in crosstalk in comparison with a display comprising conventional electron-emitting elements, the pitch between phosphors can be made more narrow, and it is not necessary to provide a grid in order to prevent electrons from striking on phosphors adjacent to the targeted phosphors. As a result, a field emission display according to the present invention is preferable from the viewpoint of improvement in resolution, downsizing and cost reduction of a display device. Since the emission of electrons can be performed even in case that the degree of vacuum inside a field emission display is comparatively low, it is possible to emit electrons even when the degree of vacuum inside the display is lowered by a cause such as a phosphor excitation and the like. Since a conventional field emission display needs to hold a comparatively large vacuum space as a margin for maintaining the emission of electrons, it has been difficult to make the display thin-sized. On the other hand, since the present invention does not need to hold a large vacuum space in advance in order to keep the emission of electrons against drop of the degree of vacuum, it is possible to make the display thin-sized.

In order to reduce a voltage to be applied to an electron-emitting element further more, it is preferable to apply a carbon coating to the first and second electrodes and the slit. In this case, by the application of the carbon coating, there is remarkable reduction of the probability to damage the first and second electrodes caused by collision between electrons and ions or by generation of heat.

In order to perform a good electron emission, it is preferable to further have a third electrode arranged at a certain space to the first and second electrodes and make the space between the first and second electrodes and the third electrode vacuum.

There is provided another field emission display comprising:

- a plurality of electron-emitting elements arranged in two dimensions; and
- a plurality of phosphors arranged at a certain space to each of these electron-emitting elements, each of the electron-emitting elements having:
- an electric field applying portion composed of at least one of a dielectric material, an electrostrictive material and an antiferroelectric material;
- a first electrode formed on one surface of this electric field applying portion; and
- a second electrode formed on the surface of the electric field applying portion, and forming a slit in cooperation with the first electrode.

Since a field emission display according to the present invention is excellent in the straight advancing ability of the electron-emitting element, it is more preferable from the viewpoint of downsizing and cost reduction of a display device.

In order to reduce the voltage to be applied to the electron-emitting element furthermore, it is preferable to apply the carbon coating to the first and second electrodes and the slit. In this case, by the application of the carbon coating, there is remarkable reduction of the probability to damage the first and second electrodes caused by collision between electrons and ions or by generation of heat.

In this case, also, in order to perform a good electron emission, it is preferable to further have a third electrode arranged at a certain space to the first and second electrodes and make the space between the first and second electrodes and the third electrode vacuum. At this time, the electric field applying portion also acts as an actuator and can control the amount of emitted electrons by the displacement motion of the electric field applying portion.

Preferably, the electron-emitting element further has a voltage source for applying a direct offset voltage to the third electrode and a resistor arranged in series between this voltage source and the third electrode. Thereby, a desired current density, namely, a desired amount of luminescence of phosphors can be easily achieved, and the short-circuit between the third electrode and the first and second electrodes is prevented.

For example, a pulse voltage is applied to the first electrode and a direct offset voltage is applied to the second electrode.

Preferably, the electron-emitting element further has a capacitor arranged in series between the first electrode and the voltage signal source. Thereby, the breakage to be caused by the short-circuit between the first and second electrodes is prevented.

Also, when the electron-emitting element further has a fourth electrode formed on the other surface of the electric field applying portion and facing the first electrode, the breakage to be caused by the short-circuit between the first and second electrodes. In this case, for example, a pulse voltage is applied to the fourth electrode and a direct offset voltage is applied to the second electrode.

In case that the electron-emitting element further has a resistor arranged in series between the second electrode and the direct offset voltage source, the breakage to be caused by the short-circuit between the first and second electrodes is prevented.

In order to achieve a sharp reduction of the voltage to be applied, it is preferable to have the relative dielectric constant of the electric field applying portion not less than 1000 and/or the width of the slit not more than 500 μm.

In order to perform a good electron emission, it is preferable for at least one of the first and second electrodes to have an angular part with an acute angle and/or for the first and second electrodes to have carbon nanotubes.

A field emission display according to the present invention further comprises a substrate having a plurality of electron-emitting elements arranged in two-dimensions and formed into one body with it.

DETAILED DESCRIPTION OF THE INVENTION

Embodiments of the electron-emitting element and the field emission display using the same will be explained with reference to the drawings.

Figure 1A:
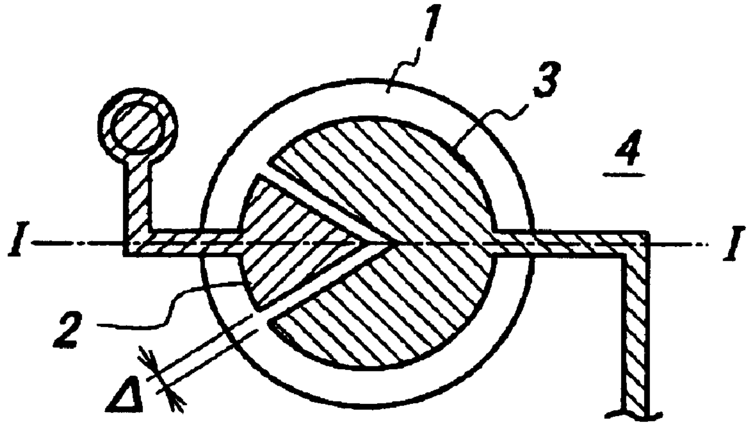
FIGS. 1A and 1B are diagrams showing a first embodiment of the electron-emitting element according to the present invention.
Figure 1B:
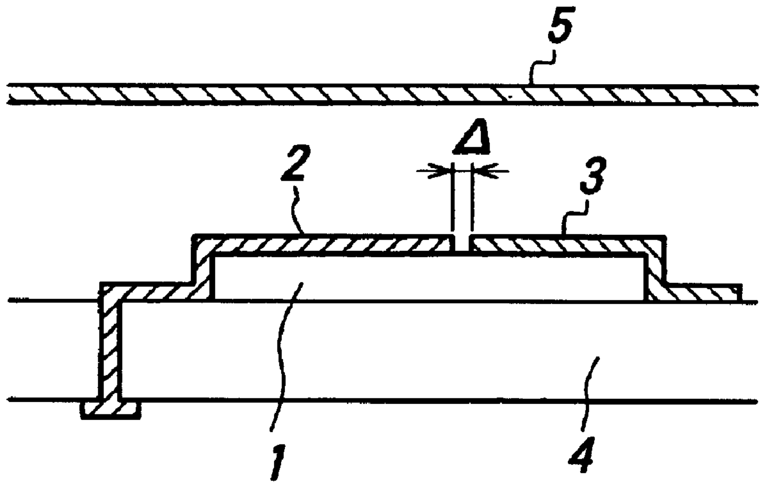

FIG. 1A is a top view of a first embodiment of the electron-emitting element according to the present invention, and FIG. 1B is a sectional view taken along line I—I. This electron-emitting element has an electric field applying portion 1 composed of a dielectric, a driving electrode 2 as a first electrode formed on one surface of the electric field applying portion 1 and a common electrode 3 as a second electrode formed on the surface on which the driving electrode 2 is formed and forming a slit in cooperation with the driving electrode 2, and the electron-emitting element is formed on a substrate 4. Preferably, in order to capture emitted electrons well, this electron-emitting element further has an electron capturing electrode 5 as a third electrode arranged at a certain space to the one surface of the electric field applying portion 1, and keeps the space therebetween in a vacuum state. And in order to prevent breakage caused by short-circuit between the driving electrode 2 and the common electrode 3, a capacitor not illustrated is arranged in series between the driving electrode 2 and an not shown voltage signal source and/or an not shown resistor is arranged in series between the common electrode 3 and an not shown direct offset voltage source.

A dielectric being comparatively high, for example, not less than 1000 in relative dielectric constant is preferably adopted as a dielectric forming the electric field applying portion 1. As such a dielectric, there can be mentioned ceramic containing barium titanate, lead zirconate, magnesium lead niobate, nickel lead niobate, zinc lead niobate, manganese lead niobate, magnesium lead tantalate, nickel lead tantalate, antimony lead stannate, lead titanate, barium titanate, magnesium lead tungstate, cobalt lead niobate or the like, or an optional combination of these, and ceramic containing these compounds of 50 wt % or more as its main ingredients, and furthermore ceramic having an oxide of lanthanum, calcium, strontium, molybdenum, tungsten, barium, niobium, zinc, manganese, nickel or the like, or some combination of these or other compounds and the like properly added to said ceramic.

For example, in case of a two-component system nPMN-mPT (n and m are represented in molar ratio) of magnesium lead niobate (PMN) and lead titanate (PT), when the molar ratio of PMN is made large, its Curie point is lowered and its relative dielectric constant at a room temperature can be made large. Particularly, the condition of "n=0.85 to 1.0, m=1.0−n" preferably makes a relative dielectric constant of 3000 or more. For example, the condition of "n=0.91, m=0.09" gives a relative dielectric constant of 15,000 at a room temperature and the condition of "n=0.95, m=0.05" gives a relative dielectric constant of 20,000 at a room temperature.

Next, in a three-component system of magnesium lead niobate (PMN), lead titanate (PT) and lead zirconate (PZ), it is preferable for the purpose of making the relative dielectric constant to make the composition of the three-component system close to the composition of the vicinity of the morphotropic phase boundary (MPB) between a tetragonal system and a pseudo-tetragonal system or between a tetragonal system and a rhombohedral system as a manner other than making the molar ratio of PMN be large.

Particularly preferably, for example, the condition of "PMN:PT:PZ=0.375:0.375:0.25" provides the relative dielectric constant of 5,500 and the condition of "PMN:PT:PZ=0.5:0.375:0.125" provides a relative dielectric constant of 4,500. Further, it is preferable to improve the dielectric constant by mixing these dielectrics with such metal as platinum within a range where the insulation ability is secured. In this case, for example, the dielectric is mixed with platinum of 20% in weight.

In this embodiment, the driving electrode 2 has an angular part with an acute angle. A pulse voltage is applied to the driving electrode 2 from a not shown power source, and electrons are emitted mainly from the angular part. In order to perform a good electron emission, the width Δ of the slit between the driving electrode 2 and the common electrode 3 is preferably not more than 500 μm. The driving electrode 2 is composed of a conductor with resistance to a high-temperature oxidizing atmosphere, for example, a single metal, an alloy, a mixture of an insulating ceramic and a single metal, a mixture of an insulating ceramic and an alloy or the like, and is preferably composed of a high-melting point precious metal such as platinum, palladium, rhodium, molybdenum or the like, or a material having such an alloy as silver-palladium, silver-platinum, platinum-palladium or the like as its main ingredient, or a cermet material of platinum and ceramic. More preferably, it is composed of only platinum or a material having a platinum-based alloy as its main ingredient. And as a material for electrodes, carbon-based or graphite-based materials, for example, a diamond thin film, a diamond-like carbon and a carbon nanotube are also preferably used. A ceramic material added to the electrode material is preferably 5 to 30 vol%.

The driving electrode 2 can be composed using the above-mentioned materials by an ordinary film forming method by means of various thick film forming methods such as screen printing, spraying, coating, dipping, application, electrophoresing and the like, or various thin film forming methods such as sputtering, ion beaming, vacuum deposition, ion plating, CVD, plating and the like, and is preferably made by these thick film forming methods.

In case of forming the driving electrode 2 by means of a thick film forming method, a thickness of driving electrode 2 is generally not more than 20 μm, and preferably not more than 5 μm.

A direct offset voltage is applied to the common electrode 3, and is led by the wiring passing through an not shown through hole from the reverse side of the substrate 4.

The common electrode 3 is formed by means of a material and method similar to those for the driving electrode 2, and preferably by means of the above-mentioned thick film forming methods. The width of the common electrode 3 also is generally not more than 20 μm and preferably not more than 5 μm.

Preferably, the substrate 4 is composed of an electrically insulating material in order to electrically separate a wire electrically connected to the driving electrode 2 and a wire electrically connected to the common electrode 3 from each other.

Therefore, the substrate 4 can be composed of a material like an enameled material obtained by coating the surface of a high heat-resistant metal with a ceramic material such as glass and the like, and is optimally composed of ceramic.

As a ceramic material to form the substrate 4, for example, stabilized zirconium oxide, aluminum oxide, magnesium oxide, titanium oxide, spinel, mullite, aluminum nitride, silicon nitride, glass, a mixture of these and the like can be used. Among them, particularly aluminum oxide and stabilized zirconium oxide are preferable from the viewpoint of strength and rigidity. Stabilized zirconium oxide is particularly preferable in that it is comparatively high in mechanical strength, comparatively high in toughness and comparatively small in chemical reaction to the driving electrode 2 and the common electrode 3. The stabilized zirconium oxide includes stabilized zirconium oxide and partially stabilized zirconium oxide. Since the stabilized zirconium oxide takes a crystal structure such as a cubic system, it undergoes no phase transition.

On the other hand, it is probable that the zirconium oxide undergoes a phase transition between a monoclinic system and a tetragonal system and has a crack generated at the time of such a phase transition. The stabilized zirconium oxide contains a stabilizer such as calcium oxide, magnesium oxide, yttrium oxide, scandium oxide, ytterbium oxide, cerium oxide, rare metal oxide and the like of 1 to 30 mol %. It is preferable for a stabilizer to contain yttrium oxide in order to improve the substrate 4 in mechanical strength. In this case, it contains yttrium of preferably 1.5 to 6 mol %, more preferably 2 to 4 mol %, and preferably further contains aluminum oxide of 1 to 5 mol %.

And its crystal phase can be made into a mixed phase of "cubic system+monoclinic system, " a mixed phase of "tetragonal system+monoclinic system," a mixed phase of "cubic system+tetragonal system+monoclinic system" or the like, and among them particularly the crystal phase having a tetragonal system or a mixed phase of "tetragonal system+cubic system" as its main crystal phase is optimal from the viewpoint of strength, toughness and durability.

In case of composing the substrate 4 of ceramic, comparatively many crystal particles form the substrate 4, and in order to improve the substrate 4 in mechanical strength, the average particle diameter of the crystal particles is be preferably 0.05 to 2 μm, and more preferably 0.1 to 1 μm.

The electric field applying portion 1, the driving electrode 2 and the common electrode 3 can be formed into one body together with the substrate 4 by applying heat treatment to the substrate 4, namely, by baking the substrate 4 each time forming one of them respectively, or these electric field applying portion 1, the driving electrode 2 and the common electrode 3 are formed on the substrate 4 and thereafter are heat-treated, namely, are baked at the same time and thereby they are formed into one body together with the substrate 4 at the same time.

Depending upon a method of forming the driving electrode 2 and common electrode 3, any heat treatment, namely, baking for unification of them may not be needed.

A heat treatment temperature, namely, a baking temperature for forming the electric field applying portion 1, the driving electrode 2 and the common electrode 3 into one body together with the substrate 4 takes a temperature range of generally 500 to 1,400° C., and preferably 1,000 to 1,400° C. In order to keep stable the composition of the electric field applying portion 1 at a high temperature in case of applying heat treatment to the film-shaped voltage applying portion 1, it is preferable to perform heat treatment, namely, baking as controlling the vapor source and the atmosphere of the electric field applying portion 1, and it is preferable to adopt a technique of baking as preventing the surface of the electric field applying portion 1 from being exposed directly to the baking atmosphere by covering the electric field applying portion 1 with a proper member. In this case a material similar to the substrate 4 is used as the covering member.

Figure 2A:
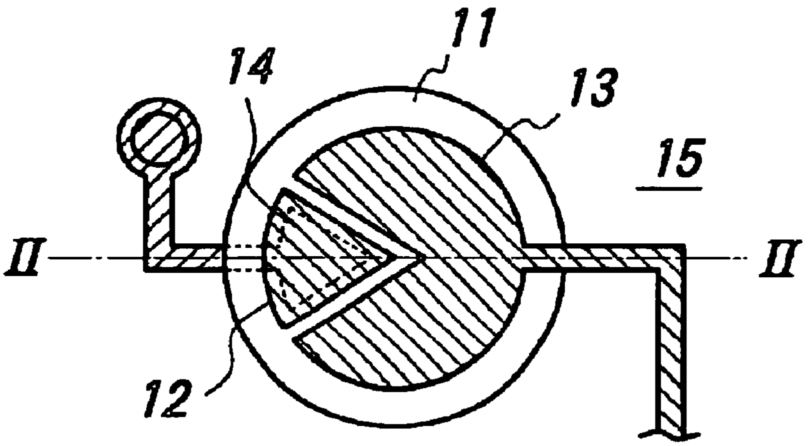
FIGS. 2A and 2B are diagrams showing a second embodiment of the electron-emitting element according to the present invention.
Figure 2B:
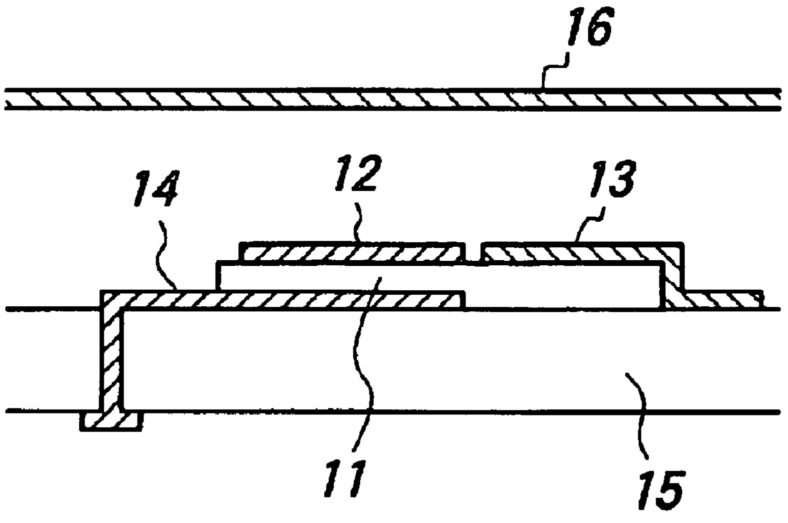

FIG. 2A is a top view of a second embodiment of the electron-emitting element according to the present invention, and FIG. 2B is a sectional view taken along a line II—II of it. This electron-emitting element has an electric field applying portion 11, a driving electrode 12 and a common electrode 13 respectively corresponding to the electric field applying portion 1, the driving electrode 2 and the common electrode 3, and additionally to them, further has a driving terminal electrode 14 as a fourth electrode formed on the other surface of the electric field applying portion 11, and they are formed on a substrate 15. In this case, also, preferably in order to capture emitted electrons well, the electron-emitting element further has an electron capturing electrode 16 as a third electrode being arranged at a certain space to one surface of the electric field applying portion 11, and keeps the space therebetween in a vacuum state.

In this embodiment, since the electric field applying portion 11 between the driving electrode 12 and the driving terminal electrode 14 acts as a capacitor, it is not necessary to provide an additional capacitor in order to prevent breakage caused by short-circuit between the driving electrode 12 and the common electrode 13. In this case, a pulse voltage is applied to the driving terminal electrode 14 and a direct offset voltage is applied to the common electrode 13.

The driving terminal electrode 14 is also formed by means of a similar material and technique to those for the driving electrode 12 and the common electrode 13, and preferably formed by means of one of the above-mentioned thick film forming methods. The thickness of the driving terminal electrode 14 is also generally not more than 20 μm, and preferably not more than 5 μm.

Figure 3A:
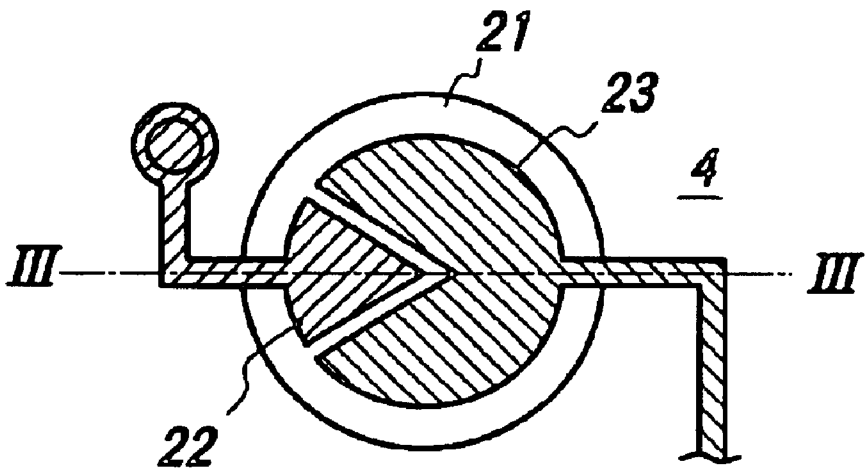
FIGS. 3A and 3B are diagrams showing a third embodiment of the electron-emitting element according to the present invention.
Figure 3B:
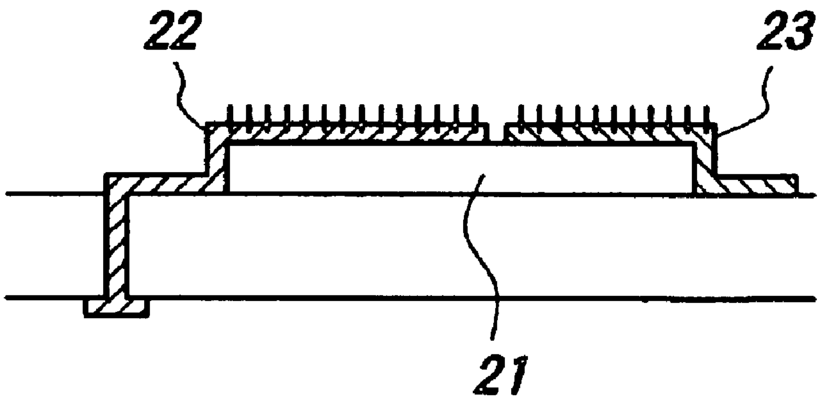

FIG. 3A is a top view of a third embodiment of the electron-emitting element according to the present invention, and FIG. 3B is a sectional view taken along a line III—III of it. In this embodiment, similarly to the first embodiment, a driving electrode 22 and a common electrode 23 are formed on one surface of an electric field applying portion 21, and a plurality of carbon nanotubes (CNT) are provided on the surfaces of these driving electrode 22 and common electrode 23, and thereby it is easy to emit electrons from the top of the CNT when applying a pulse voltage to the driving electrode 22 and applying a direct offset voltage to the common electrode 23.

Figure 4A:
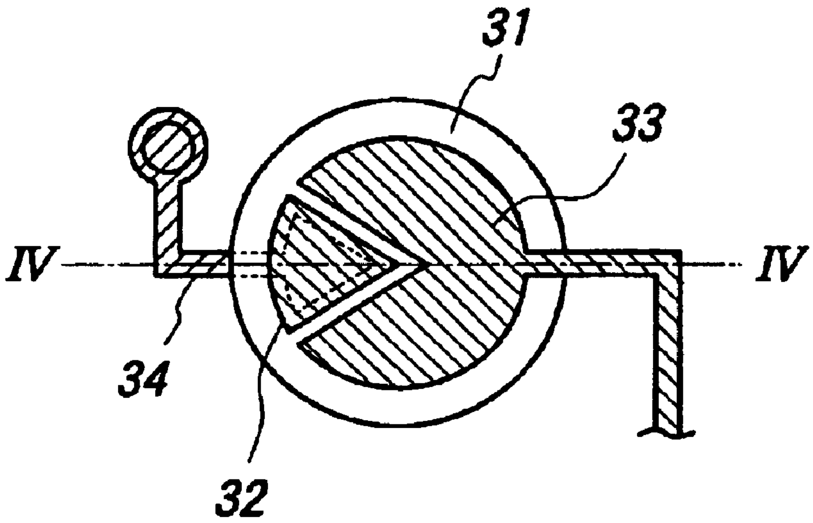
FIGS. 4A and 4B are diagrams showing a fourth embodiment of the electron-emitting element according to the present invention.
Figure 4B:
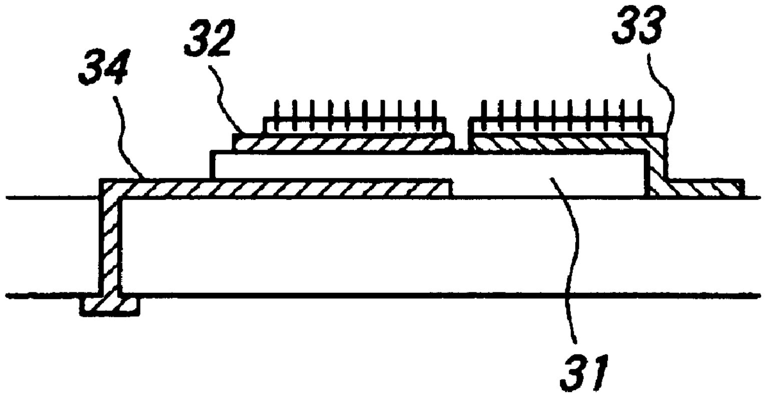

FIG. 4A is a top view of a fourth embodiment of the electron-emitting element according to the present invention, and FIG. 4B is a sectional view taken along a line IV—IV of it. In this embodiment, similarly to the second embodiment, a driving electrode 32 and a common electrode 33 are formed on one surface of an electric field applying portion 31, and a driving terminal electrode 34 is formed on the other surface of it, and a plurality of carbon nanotubes (CNT) are provided on the surfaces of these driving electrode 32 and common electrode 33, and thereby it is easy to emit electrons from the top of the CNT when applying a pulse voltage to the driving electrode 32 and applying a direct offset voltage to the common electrode 33.

Figure 5A:
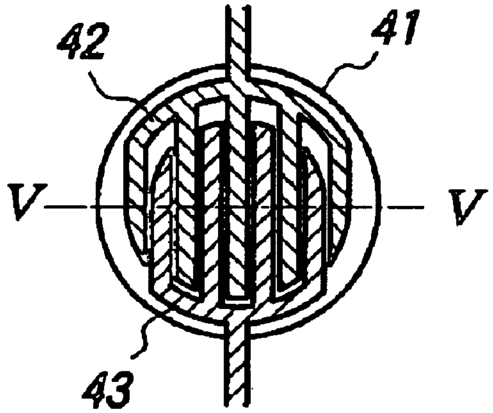
FIGS. 5A and 5B are diagrams showing a fifth embodiment of the electron-emitting element according to the present invention.
Figure 5B:
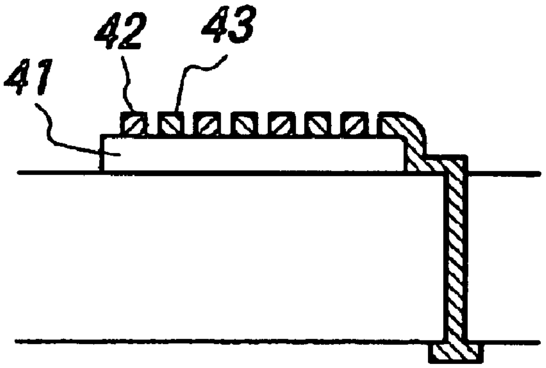

FIG. 5A is a top view of a fifth embodiment of the electron-emitting element according to the present invention, and FIG. 5B is a sectional view taken along a line V—V of it. In this embodiment, a driving electrode 42 and a common electrode 43 which are in the shape of the teeth of a comb are formed on one surface of an electric field applying portion 41. In this case, it is easy to emit electrons from the angular parts of these driving electrode 42 and common electrode 43.

Figure 6A:
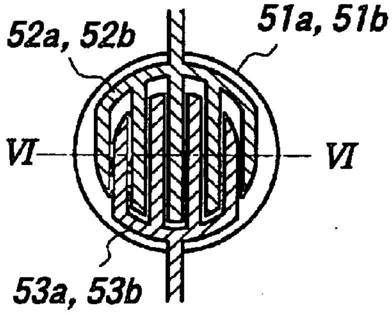
FIGS. 6A and 6B are diagrams showing a sixth embodiment of the electron-emitting element according to the present invention.
Figure 6B:
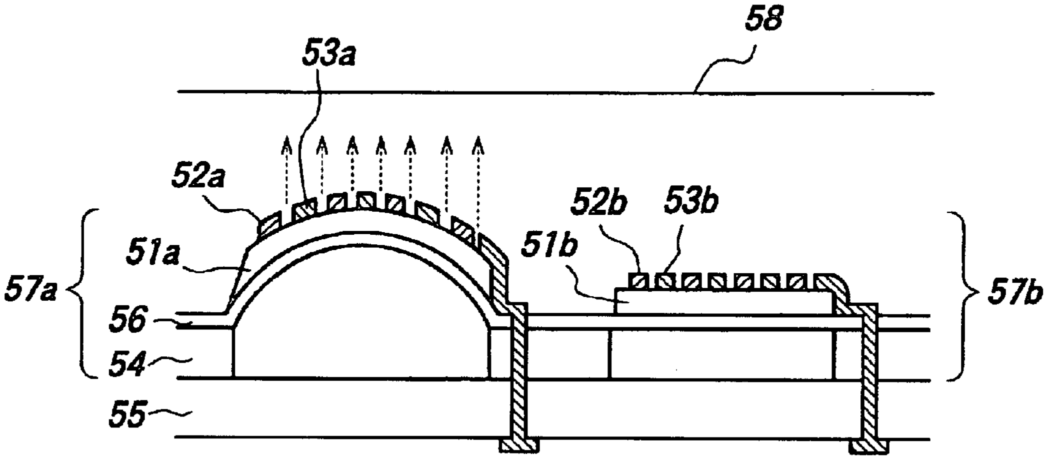

FIG. 6A is a top view of a sixth embodiment of the electron-emitting element according to the present invention, and FIG. 6B is a sectional view taken along a line VI—VI of it. In this embodiment, the electron-emitting element has electric field applying portions 51*a*, 51*b* made of an antiferroelectric material, and driving electrodes 52*a*, 52*b* and common electrodes 53*a*, 53*b* which are in the shape of the teeth of a comb and are formed respectively on one-side surfaces of the electric field applying portions 51*a*, 51*b*.

The electron-emitting element is disposed on a sheet layer 56 provided through a spacer layer 54 on a substrate 55. Thereby, the electric field applying portions 51*a*, 51*b*, the driving electrodes 52*a*, 52*b*, the common electrodes 53*a*, 53*b*, the sheet layer 56 and the spacer layer 54 form actuators 57*a*, 57*b*, respectively.

As an antiferroelectric material for forming the electric field applying portions 51*a*, 51*b*, it is preferable to use a material having lead zirconate as its main ingredient, a material having a component consisting of lead zirconate and lead stannate as its main ingredient, a material obtained by adding lanthanum oxide to lead zirconate, or a material obtained by adding lead zirconate or lead niobate to a component consisting of lead zirconate and lead stannate. Particularly, in case of driving the electron-emitting element at a low voltage, it is preferable to use an antiferroelectric material containing a component consisting of lead zirconate and lead stannate. Its composition is as follows.

$$PB_{0.99}Nb_{0.02}[(Zr_xSn_{1-x})_{1-y}Ti_y]_{0.98}O_3$$

And the antiferroelectric materials can be also made porous, and in this case it is preferable to make the porosity be not more than 30%.

The electric field applying portions 51*a*, 51*b* are preferably formed by means of one of the above-mentioned thick film forming methods, and a screen printing method is preferably in particular used by reason that it can perform inexpensively a fine printing. The thickness of the electric field applying portions 51*a*, 51*b* is made to be preferably 50 μm or less and more preferably 3 to 40 μm from the reason of obtaining a large displacement at a low operating voltage and the like.

By such a thick film forming technique, a film can be formed on the surface of the sheet layer 56 using paste or slurry having as its main ingredient antiferroelectric ceramic particles having the average particle diameter of 0.01 to 7 μm, preferably 0.05 to 5 μm, and a good element characteristic can be obtained.

An electrophoresis method can form a film in a high density under a high shape control, and has features as described in technical papers "DENKI KAGAKU (ELECTROCHEMISTRY) 53, No.1 (1985), pp.63–68 by Kazuo Anzai" and "First Study Meeting On Method For High Order Forming Of Ceramic By Electrophoresis, Collection of Papers (1998), pp.5–6 and pp.23–24." Therefore, it is preferable to properly select and use a technique from various techniques in consideration of required accuracy, reliability and the like.

The sheet layer 56 is relatively thin and has a structure liable to receive vibration from an external stress. The sheet layer 56 is preferably composed of a high heat-resisting material. The reason is to prevent the sheet layer 56 from deteriorating in quality at least when forming the electric field applying portions 51*a*, 51*b* in case of using a structure directly supporting the sheet layer 56 without using a material being comparatively low in heat resistance such as an organic adhesive and the like at the time of joining a driving terminal electrode directly to the sheet layer 56 as shown in FIGS. 2 and 4. In case of forming the sheet layer 56 out of ceramic, it is formed in a similar manner to the substrate 4 in FIG. 1.

The spacer layer 54 is preferably formed out of ceramic, and it may be formed out of the same material as or a different material from a ceramic material forming the sheet layer 56. As such ceramic, in the same manner as a ceramic material for forming the sheet layer 56, for example, stabilized zirconium oxide, aluminum oxide, magnesium oxide, titanium oxide, spinel, mullite, aluminum nitride, silicon nitride, glass, a mixture of these, and the like can be used.

As ceramic materials different from ceramic materials forming the spacer layer 54, the substrate 55 and the sheet layer 56, a material having zirconium oxide as its main ingredient, a material having aluminum oxide as its main ingredient, a material having a mixture of these as its main ingredient and the like are preferably adopted. Among them, a material having zirconium oxide as its main ingredient is particularly preferable. Clay or the like may be added as a sintering adjuvant, but it is necessary to adjust the composition of such an adjuvant so as not to contain excessively such an ingredient being liable to glass as silicon oxide, boron oxide and the like. The reason is that these materials liable to glass are advantageous from the viewpoint of joining with the electric field applying portions 51_a_, 51_b_, but they accelerate reaction with the electric field applying portions 51_a_, 51_b_, make it difficult for the electric field applying portions 51_a_, 51_b_ to keep their specified composition, and as the result, causes the element characteristics to be deteriorated.

That is to say, it is preferable to limit silicon oxide and the like contained in the spacer layer 54, the substrate 55 and the sheet layer 56 to not more than 3% in weight, preferably not more than 1%. Here, an ingredient occupying not less than 50% in weight is referred to as the main ingredient.

The spacer layer 54, the substrate 55 and the sheet layer 56 are preferably formed into a 3-layered laminate, and in this case, for example, simultaneous unification baking, joining the respective layers by glass or resin together with each other into one body or after-joining is performed. They can be also formed into a laminate having not less than four layers.

In case of forming the electric field applying portions 51_a_, 51_b_ out of an antiferroelectric material like this embodiment, they become flat like the electric field applying portion 51_b_ in a state where no electric field is applied, while they are bent and displaced in a convex shape like the electric field applying portion 51_a_ when an electric field is applied to them. Since the space between the electron-emitting element and the electron capturing electrode 58 being opposite to it is made narrow by bending in such a convex shape, the straight advancing ability of electrons generated is more improved as shown by arrows. Therefore, it is possible to control the amount of emitted electrons to reach the electron capturing electrode 58 by means of this quantity of bending.

Next, the operation of the electron-emitting element according to the present invention is described.

Figure 7A:
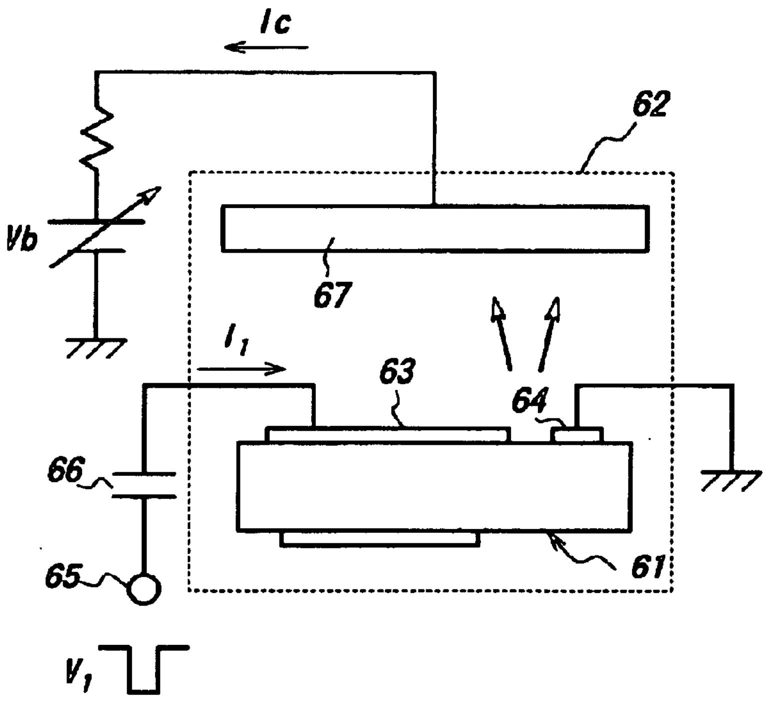
FIGS. 7A and 7B are diagrams for explaining the operation of the electron-emitting element according to the present invention.

FIG. 7 is a diagram for explaining the operation of the electron-emitting element according to the present invention. In this case, a current control element 61 has a structure shown in FIG. 1, and the circumstance of the current control element 61 is kept in a vacuum state by a vacuum chamber 62. And a capacitor 66 is arranged in series between a driving electrode 63 and a common electrode 64 in order to prevent short-circuit between the driving electrode 63 and the common electrode 64. A bias voltage Vb is applied to an electron capturing electrode 67 opposite to the driving electrode 63 and the common electrode 64.

Figure 7B:
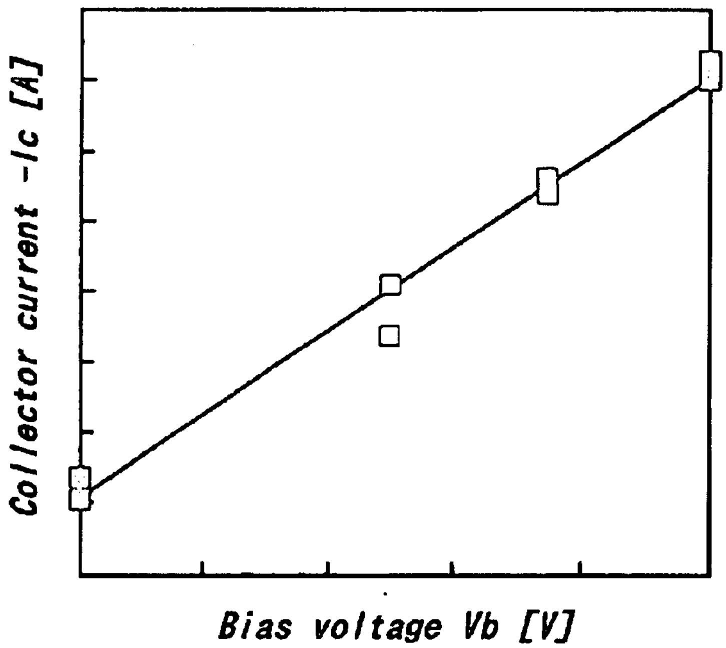

In case of making the voltage VI to be applied to a signal voltage source 65 to be −400 V, the capacity of the capacitor 66 to be 500 pF, the bias voltage to be 0 V, the width of a slit formed by the driving electrode 63 and the common electrode 64 to be 10 μm, and the degree of vacuum inside the vacuum chamber 62 to be $1\times10^{-3}$ Pa, the current $I_1$ flowing through the driving electrode 63 becomes 2.0 A and the density of a collector current Ic taken from the electron capturing electrode 67 becomes 1.2 A/cm$^2$. As a result, according to an electron-emitting element of the present invention, a higher current density is obtained at a lower voltage and a lower degree of vacuum in comparison with a conventional electron-emitting element, and as a result an excellent straight advancing ability is displayed. As shown in FIG. 7B, the collector current Ic becomes larger as the bias voltage Vb becomes higher.

Figure 8A:
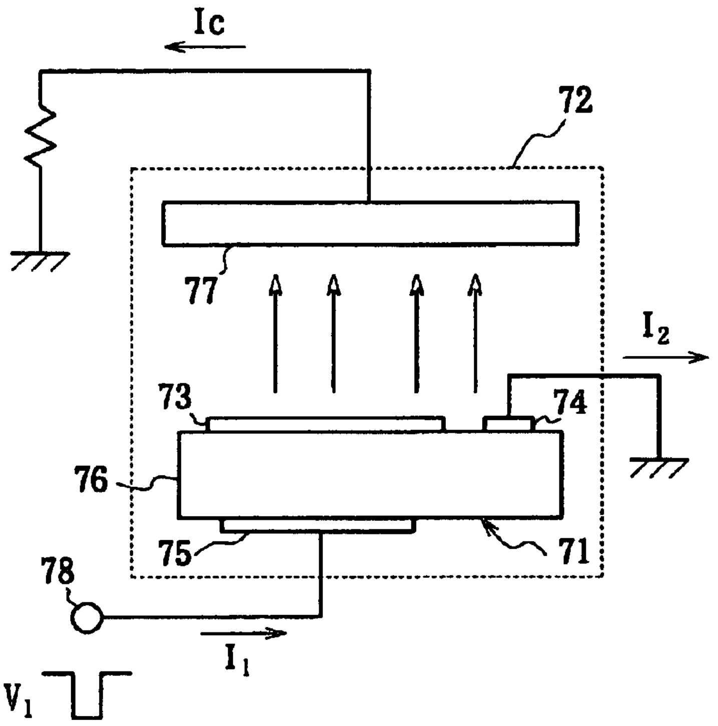
FIGS. 8A and 8B are diagrams for explaining the operation of the other electron-emitting element according to the present invention.
Figure 8B:
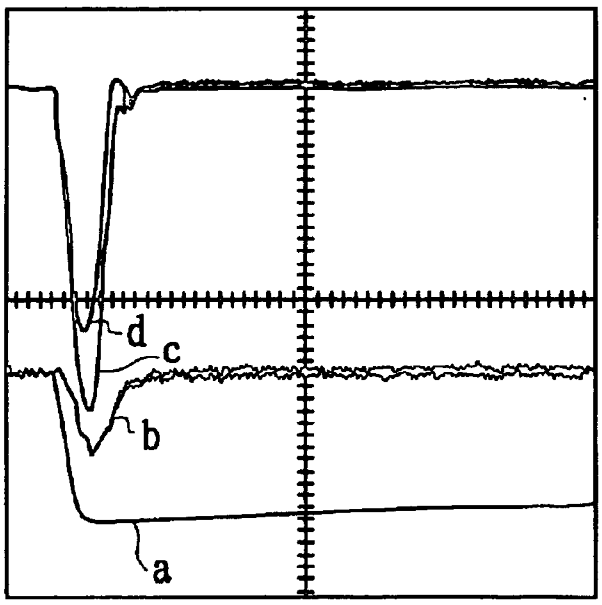

FIG. 8 is a diagram for explaining the operation of the other electron-emitting element according to the present invention. In this case, a current control element 71 has a structure shown in FIG. 2, and the circumstance of the current control element 71 is kept in a vacuum state by a vacuum chamber 72. And an electric field applying portion 76 between a driving electrode 73 and a driving terminal electrode 75 acts as a capacitor in order to prevent short-circuit between the driving electrode 73 and the common electrode 74. An electron capturing electrode 77 is opposite to the driving electrode 73 and the common electrode 74.

In case of making the voltage V1 to be applied to a signal voltage source 78 to be −400 V, the capacity of the electric field applying portion 76 acting as a capacitor to be 530 pF, the width of a slit formed by the driving electrode 73 and the common electrode 74 to be 10 μm, and the degree of vacuum inside the vacuum chamber 72 to be $1\times10^{-3}$ Pa, the current $I_1$ flowing through the driving terminal electrode 75 becomes 2.0 A and the density of a collector current Ic taken from the electron capturing electrode 77 becomes 1.2 A/cm$^2$. As a result, according to another electron-emitting element of the present invention, a higher current density is obtained at a lower voltage and a lower degree of vacuum in comparison with a conventional electron-emitting element, and as a result an excellent straight advancing ability is displayed. The waveforms of the voltage $V_1$, and the currents Ic, $I_1$ and $I_2$ are respectively shown by curves a to d in FIG. 8B.

Figure 9:
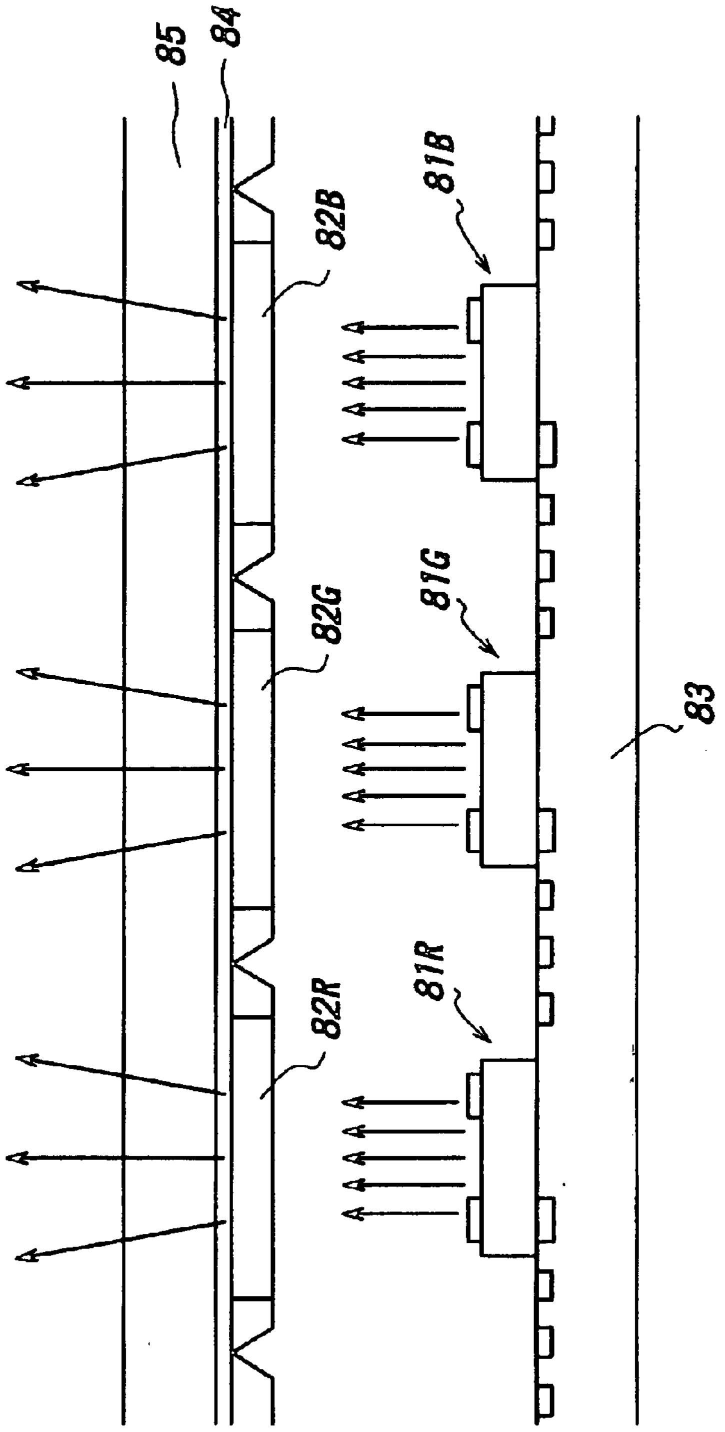
FIG. 9 is a diagram showing an embodiment of the FED according to the present invention.

FIG. 9 is a diagram showing an embodiment of the FED according to the present invention. This FED comprises a plurality of electron-emitting elements 81R, 81G and 81B arranged in two dimensions, and a red phosphor 82R, green phosphor 82G and blue phosphor 82B being arranged at a certain space to these electron-emitting elements 81R, 81G and 81B, respectively.

In this embodiment, the electron-emitting elements 81R, 81G and 81B are formed on a substrate 83, and the red phosphor 82R, green phosphor 82G and blue phosphor 82B are formed through the electron capturing electrode 84 on a glass substrate 85. The electron-emitting elements 81R, 81G and 81B each have a structure shown in FIG. 2, but may have any of the structures shown in FIGS. 1 and 3 to 6.

According to this embodiment, since the electron-emitting elements 81R, 81G and 81B are excellent in straight advancing ability, the crosstalk is smaller compared with a case of having conventional electron-emitting elements and the pitch between the phosphors 82R, 82G and 82B can be narrower, and it is not necessary to provide a grid in order to prevent electrons from striking on adjacent phosphors 82R, 82G and 82B. As a result, the FED of this embodiment is preferable from the viewpoint of downsizing and cost reduction. Since it can emit electrons even if the degree of vacuum is comparatively low, it is not necessary to leave a margin for a lowering of vacuum by making the vacuum space large in advance and thus restrictions against making the FED thin-sized are reduced.

Figure 10:
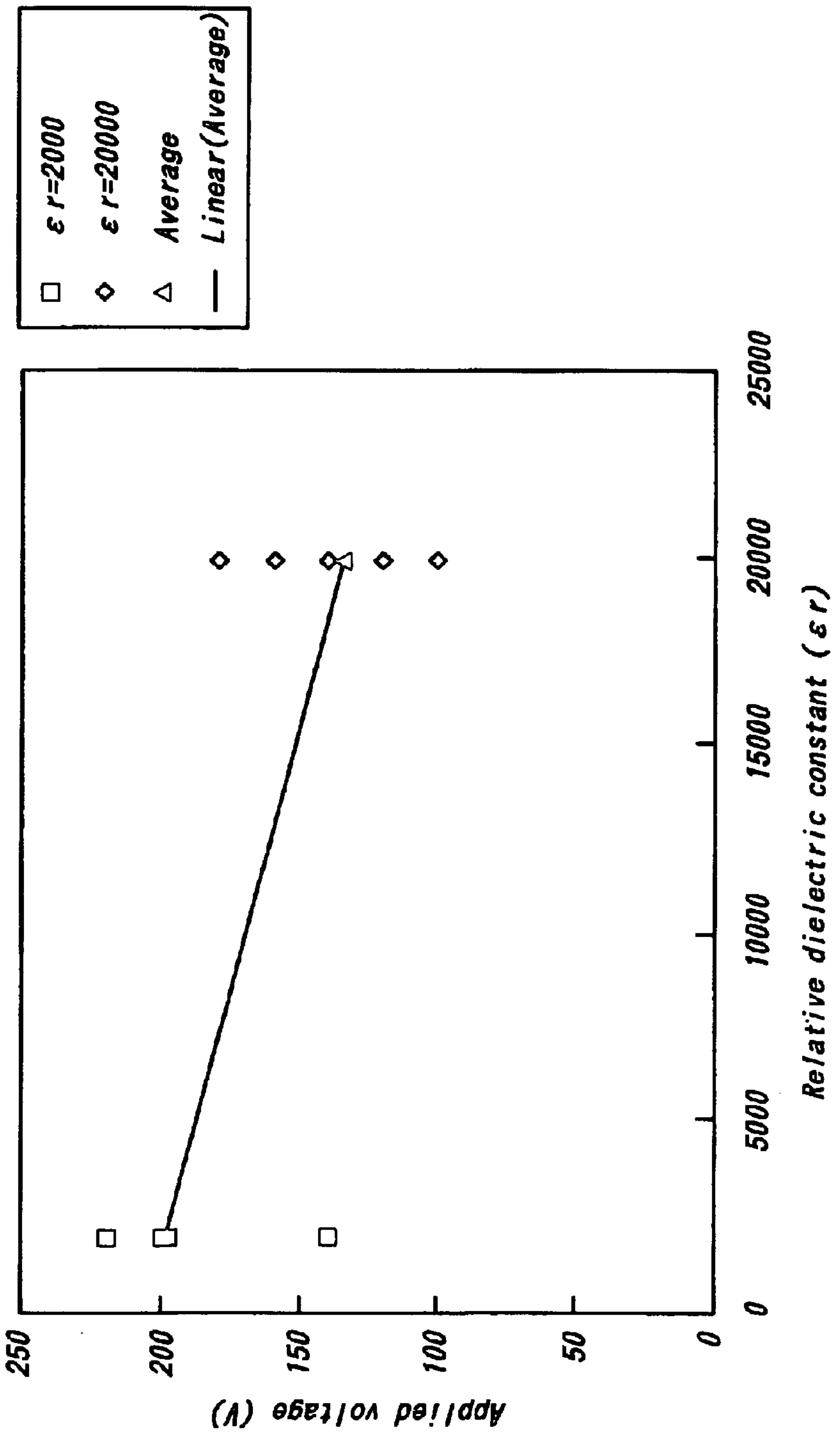
FIG. 10 is a diagram showing the relation between the relative dielectric constant of the electron-emitting element according to the present invention and the applied voltage to the electron-emitting element.
Figure 11:
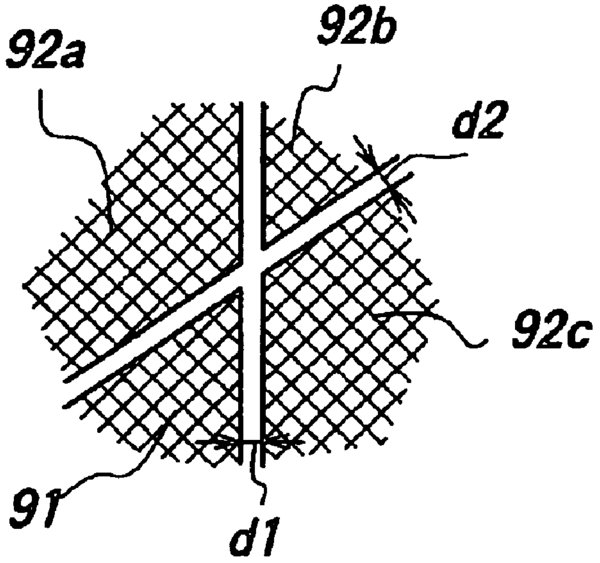
FIG. 11 is a diagram for explaining FIG. 10.

FIG. 10 is a diagram showing the relation between the relative dielectric constant of an electron-emitting element according to the present invention and an applied voltage to it, and FIG. 11 is a diagram for explaining it. The characteristic of FIG. 10 shows the relationship between the relative dielectric constant of an electric field applying portion and the applied voltage required for emission of electrons in case that each of the widths d1 and d2 of slits formed by a driving electrode 91 and common electrodes 92*a* to 92*c* as shown in FIG. 11 is 10 μm.

As shown in FIG. 10, in case of driving an electron-emitting element by means of a lower applied voltage compared with the conventional electron-emitting element, it is known that the relative dielectric constant is preferably not less than 1000.

Figure 12:
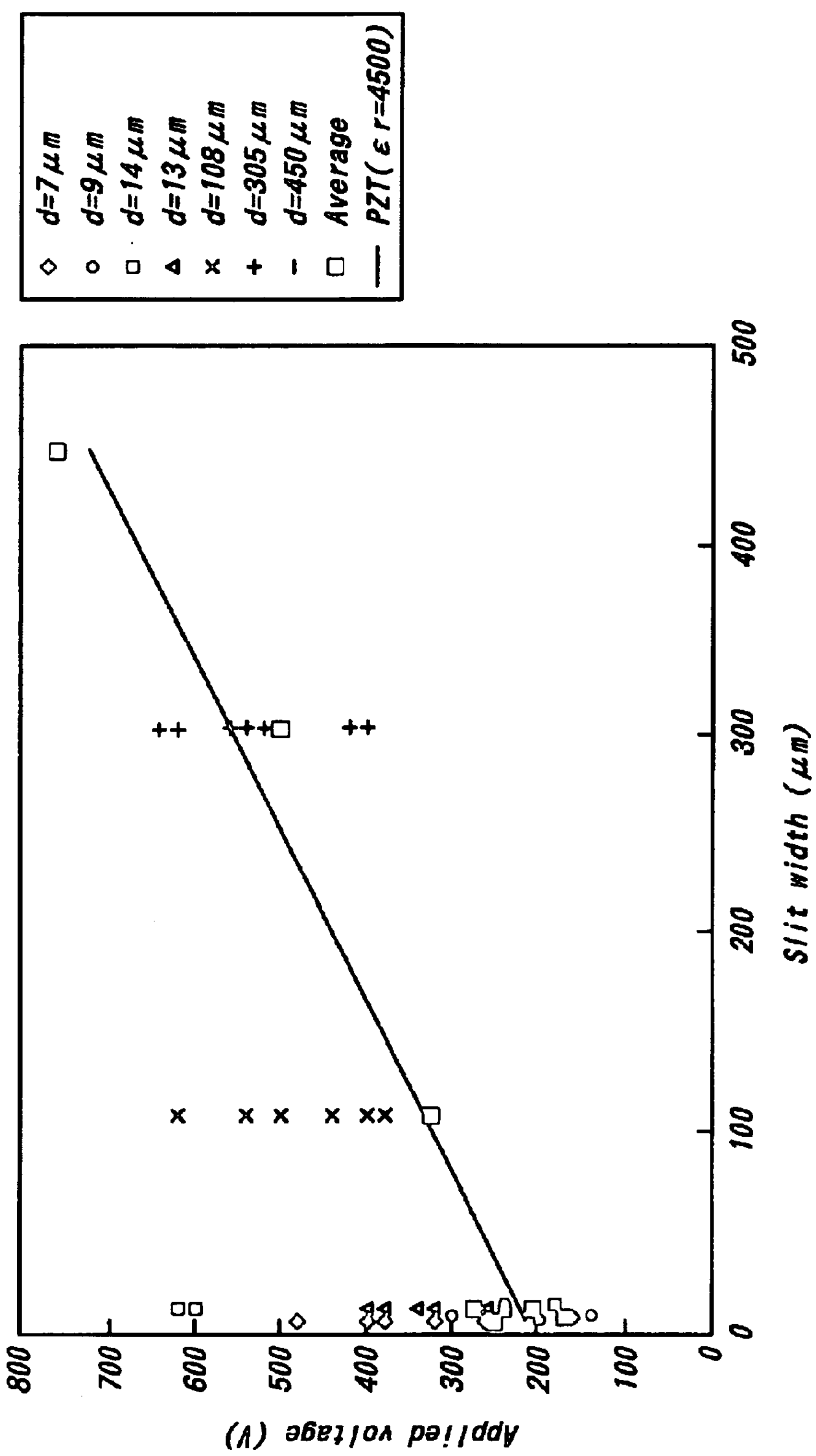
FIG. 12 is a diagram showing the relation between the slit width of the electron-emitting element according to the present invention and an applied voltage to the electron-emitting element.

FIG. 12 is a diagram showing the relation between the width of a slit of the electron-emitting element according to the present invention and an applied voltage to it. From FIG. 12 it is known that it is necessary to make the slit width be not more than 500 μm in order to make an electron emission phenomenon occur. In order to drive the electron-emitting element according to the present invention by means of a driver IC to be used in a plasma display, a fluorescent display tube or a liquid crystal display which are on the market, it is necessary to make the slit width be not more than 20 μm.

Figure 13A:
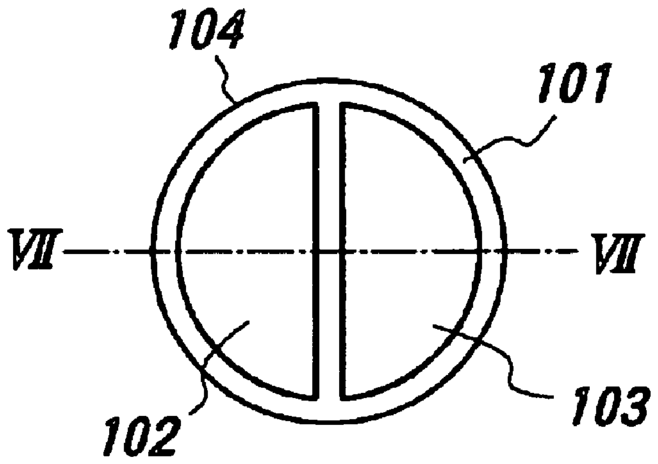
FIGS. 13A and 13B are diagrams showing a seventh embodiment of the electron-emitting element according to the present invention.
Figure 13B:
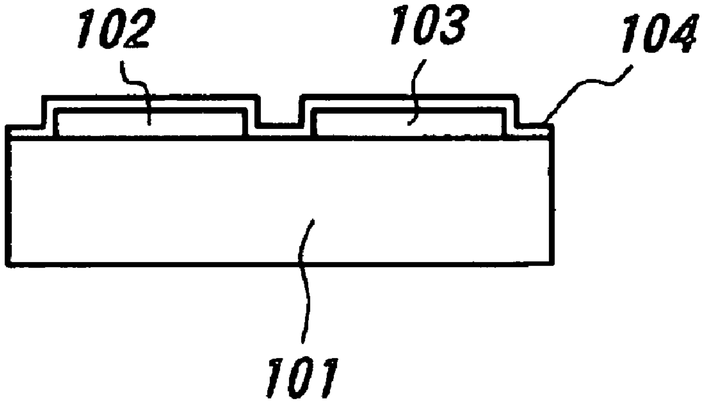

FIG. 13A is a top view of a seventh embodiment of the electron-emitting element according to the present invention, and FIG. 13B is a sectional view taken along a line VII—VII of it. In this embodiment, a driving electrode 102 and a common electrode 103 each being in the shape of a semicircle are formed on one side of an electric field applying portion 101, and a carbon coating 104 is applied to the driving electrode 102, the common electrode 103 and a slit formed by them.

Figure 14A:
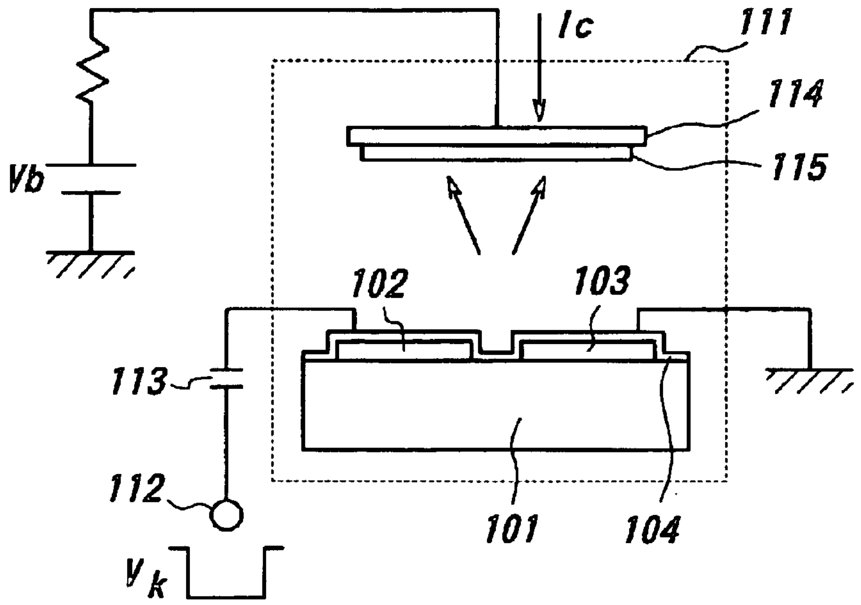
FIGS. 14A and 14B are diagrams for explaining the operation of the electron-emitting element of FIGS. 13A and 13B.
Figure 14B:
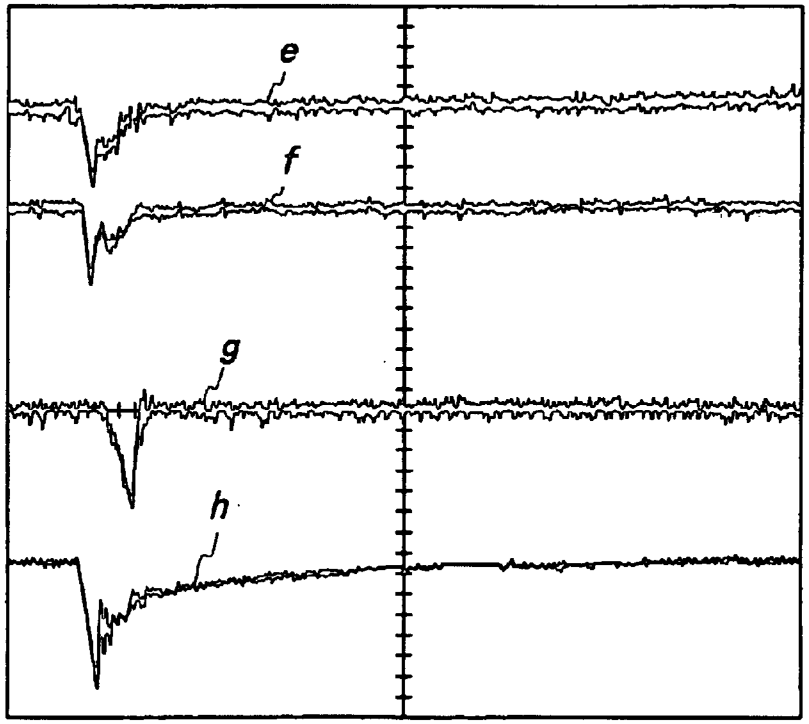

The operation of the electron-emitting element having a structure shown in FIG. 13 is described with reference to FIG. 14. In this case, the periphery of the electron-emitting element is kept in a vacuum state by a vacuum chamber 111. A capacitor 113 is arranged in series between the driving electrode 102 and the voltage signal source 112 in order to prevent short-circuit between the driving electrode 102 and the common electrode 103. An electron capturing electrode 114 opposite to the driving electrode 102 and the common electrode 103 has a phosphor 115 provided on it and has a bias voltage Vb applied to it.

The driving electrode 102 and the common electrode 103 each are an Au film of 3 μm in thickness, and a carbon coating 104 (of 3 μm in film thickness) is applied to these driving electrode 102 and common electrode 103 and the slit part therebetween. In case of making a voltage Vk to be applied to the signal voltage source 112 to be 25 V, making the capacity of the capacitor 113 to be 5 nF, making a bias voltage Vb to be 300 V, forming the electric field applying portion 101 out of an electrostrictive material of 14,000 in relative dielectric constant, making the width of a slit formed by the driving electrode 102 and the common electrode 103 to be 10 μm, and making the degree of vacuum inside the vacuum chamber 111 to be $1\times10^{-3}$ Pa, a current Ic flowing through the electron capturing electrode 114 becomes 0.1 A and a current of about 40% of a current $I_1$ (0.25 A) flowing through the driving electrode 102 is taken as an electron current, and a voltage Vs between the driving electrode 102 and the common electrode 103, namely, a voltage required for emission of electrons, becomes 23.8 V. As a result, according to the electron-emitting element shown in FIG. 13, a voltage necessary for emission of electrons can be remarkably lowered. And the carbon coating 104 remarkably reduces the possibility that the driving electrode 102 and the common electrode 103 are damaged by collision of electrons or ions, or by generation of heat. The waveforms of the current $I_1$ flowing through the driving electrode 102, the currents $I_2$, Ic flowing through the common electrode 103, and the voltage Vs are respectively shown by curves e to h in FIG. 14B.

Figure 15A:
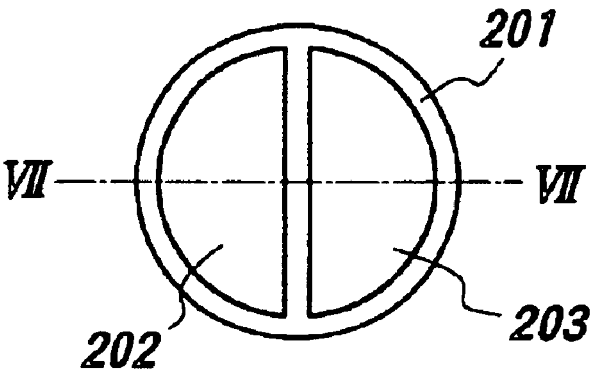
FIGS. 15A and 15B are diagrams showing an eighth embodiment of the electron-emitting element according to the present invention.
Figure 15B:
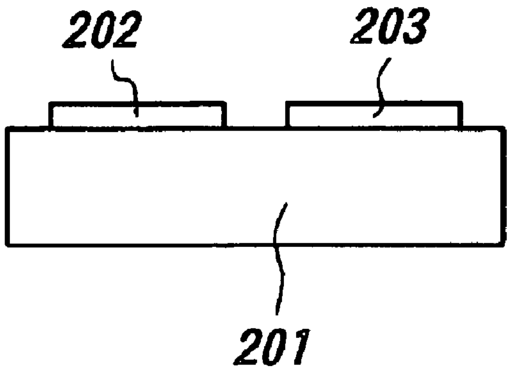

FIG. 15A is a top view of an eighth embodiment of the electron-emitting element according to the present invention, and FIG. 15B is a sectional view taken along a line VIII—VIII of it. In this embodiment, a driving electrode 202 and a common electrode 203 each being in the shape of a semicircle are formed on one side of an electric field applying portion 201.

Figure 16A:
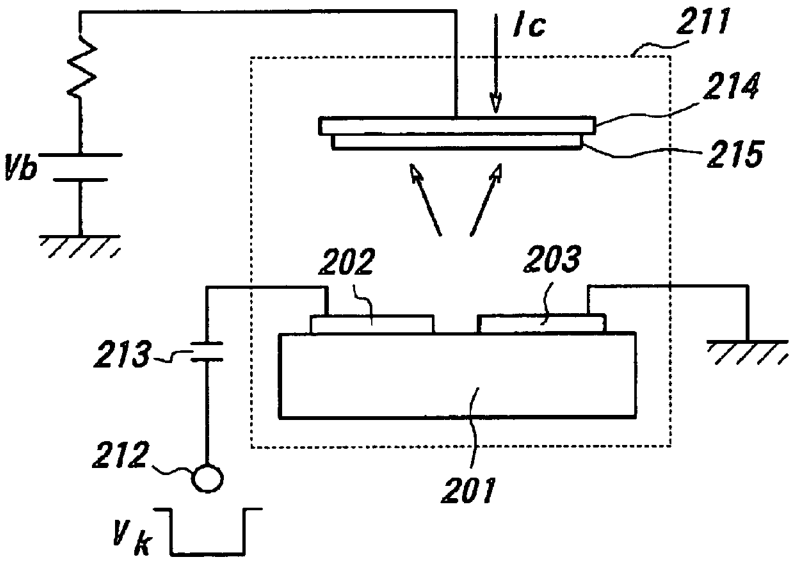
FIGS. 16A and 16B are diagrams for explaining the operation of the electron-emitting element of FIGS. 15A and 15B.
Figure 16B:
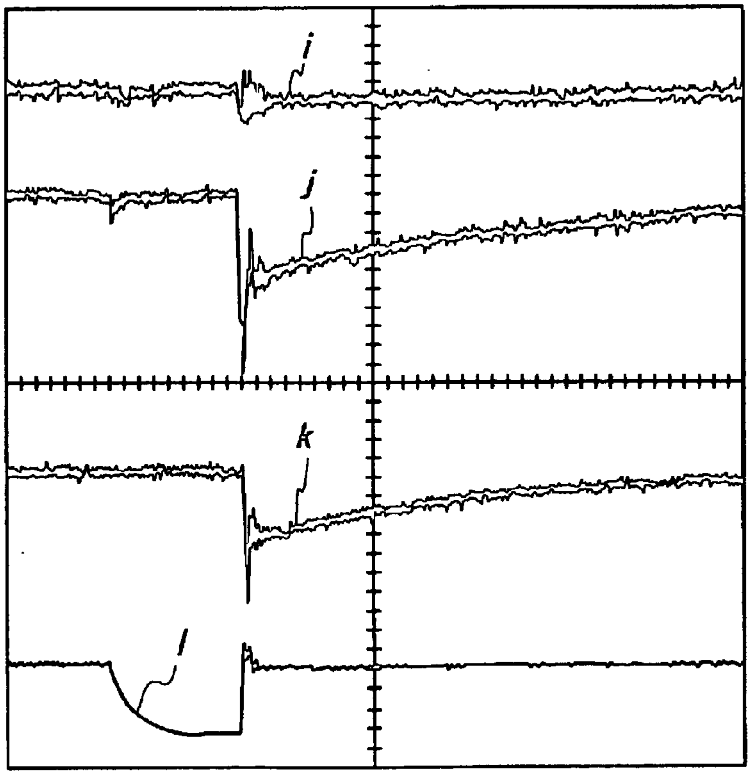

It is described with reference to FIG. 16 that electrons are emitted at a low vacuum of not more than 200 Pa also in case of an electron-emitting element having a structure shown in FIG. 15, namely, in case of having no carbon coating. In this case, the circumstance of the electron-emitting element is kept in a vacuum state by a vacuum chamber 211. A capacitor 213 is arranged in series between the driving electrode 202 and a voltage signal source 212. An electron capturing electrode 214 opposite to the driving electrode 202 and the common electrode 203 has a phosphor 215 provided on it and has a bias voltage Vb applied to it.

A material for each of the driving electrode 102 and the common electrode 103 is Au, and in case of making a voltage Vk to be applied to the signal voltage source 212 to be 160 V, making the capacity of the capacitor 213 to be 5 nF, making the bias voltage Vb to be 300 V, forming the electric field applying portion 201 out of an electrostrictive material of 4,500 in relative dielectric constant, making the width of a slit formed by the driving electrode 202 and the common electrode 203 to be 10 μm, and making the degree of vacuum inside the vacuum chamber 211 to be 200 Pa or less, a current Ic flowing through the electron capturing electrode 214 becomes 1.2 A and a current of about 60% of a current $I_1$ (2 A) flowing through the driving electrode 202 is taken as an electron current, and a voltage Vs between the driving electrode 202 and the common electrode 203, namely, a voltage required for emission of electrons, becomes 153 V. The waveforms of the currents $I_1$, $I_2$ and Ic, and the voltage Vs are respectively shown by curves i to 1 in FIG. 16B.

It is the same also in case of having a carbon coating that a sufficient electron emission can be made at a very low vacuum of not more than 200 Pa as described above.

Since the electron-emitting element according to the present invention can emit electrons at a very low vacuum of not more than 200 Pa, in case of forming an FED, it is possible to make very small a sealed space of the outer circumferential part of a panel, and thus it is possible to realize a narrow-frame panel. And in case of make a large-sized display by arranging a plurality of panels, a joint between panels is made hard to be conspicuous. Further, in a conventional FED the degree of vacuum of a space inside the FED is lowered by gas produced from a phosphor and the like and there is the possibility that the durability of a panel receives a bad influence, but since a display using the electron-emitting element according to the present invention can emit electrons at a very low vacuum of not more than 200 Pa, a bad influence caused by lowering of the degree of vacuum of a space inside the FED is greatly reduced and the durability and reliability of the panel are greatly improved.

The electron-emitting element according to the present invention and the FED using it can be more simplified and made more small-sized in comparison with those of the prior art. Concretely explaining them, first since the degree of vacuum in a space inside an FED can be made low, an enclosure supporting structure facing a pressure difference between the inside and the outside of the outer circumferential sealed part and the like of an FED can be simplified and made small-sized.

And since an applied voltage necessary for emitting electrons and a bias voltage to be applied to an electron capturing electrode can be made comparatively low, the FED does not need to be of a pressure-resisting structure and it is possible to make the whole display device small-sized and the panel thin-sized. A bias voltage to be applied to the electron capturing electrode may be 0 V.

And since the electric field applying portion of the electron-emitting element according to the present invention can be formed without the need of special processing, as required in case of forming an electron-emitting element of a Spindt type, and furthermore the electrodes and the electric field applying portion can be formed by a thick film printing method, an electron-emitting element according to the present invention and an FED using it can be manufactured in lower cost in comparison with those of the prior art.

Moreover, since an applied voltage necessary for emitting electrons and a bias voltage to be applied to an electron capturing electrode can be made comparatively low, a driving IC being comparatively low in dielectric strength, small-sized and inexpensive can be used and therefore an FED using an electron-emitting element according to the present invention can be manufactured in low cost.

The present invention is not limited to the embodiments described above but can be variously modified and varied in many manners.

For example, the electron-emitting element according to the present invention can be also applied to another application such as backlighting. Since the electron-emitting element according to the present invention can emit a comparatively large amount of electron beam at a comparatively low voltage, it is preferable for forming a small-sized and high-efficiency sterilizer in place of a conventional sterilizer using mainly an ultraviolet ray emission method. And the electron-emitting element according to the present invention can adopt any other electrode structure having an angular part. Further, it can arrange a resistor in series between a second electrode, namely, a common electrode and a direct offset voltage source in order to prevent short-circuit between a driving electrode and a common electrode.

In the sixth embodiment, the case where the electric field applying portions 51*a*, 51*b* are formed out of an antiferroelectric material has been described, but it is enough that the electric field applying portions 51*a*, 51*b* are formed out of at least one of a piezoelectric material, an electrostrictive material and an antiferroelectric material. In case of using a piezoelectric material and/or an electrostrictive material, there can be used for example a material having lead zirconate (PZ-based) as its main ingredient, a material having nickel lead niobate as its main ingredient, a material having zinc lead niobate as its main ingredient, a material having manganese lead niobate as its main ingredient, a material having magnesium lead tantalate as its main ingredient, a material having nickel lead tantalate as its main ingredient, a material having antimony lead stannate as its main ingredient, a material having lead titanate as its main ingredient, a material having magnesium lead tungstate as its main ingredient, a material having cobalt lead niobate as its main ingredient, or a composite material containing an optional combination of these materials, and among them a ceramic material containing lead zirconate is most frequently used as a piezoelectric material and/or an electrostrictive material.

In case of using a ceramic material as a piezoelectric material and/or an electrostrictive material, a proper material obtained by properly adding an oxide of lanthanum, barium, niobium, zinc, cerium, cadmium, chromium, cobalt, antimony, iron, yttrium, tantalum, tungsten, nickel, manganese, lithium, strontium, bismuth or the like, or a combination of some of these materials or other compounds to the ceramic material, for example, a material obtained by adding a specific additive to it so as to form a PZT-based material is also preferably used.

Among these piezoelectric materials and/or electrostrictive materials, a material having as its main ingredient a component consisting of magnesium lead niobate, lead zirconate and lead titanate, a material having as its main ingredient a component consisting of nickel lead niobate, magnesium lead niobate, lead zirconate and lead titanate, a material having as its main ingredient a component consisting of magnesium lead niobate, nickel lead tantalate, lead zirconate and lead titanate, a material having as its main ingredient a component consisting of magnesium lead tantalate, magnesium lead niobate, lead zirconate and lead titanate, and a material substituting strontium and/or lanthanum for some part of lead in these materials and the like are preferably used, and they are preferable as a material for forming the electric field applying portions 51*a*, 51*b* by means of a thick film forming technique such as a screen printing method and the like as described above.

In case of a multiple-component piezoelectric material and/or electrostrictive material, its piezoelectric and/or electrostrictive characteristics vary depending upon the composition of their components, and a three-component material of magnesium lead niobate-lead zirconate-lead titanate, or a four-component material of magnesium lead niobate-nickel lead tantalate-lead zirconate-lead titanate or a four-component material of magnesium lead tantalate-magnesium lead niobate-lead zirconate-lead titanate preferably has the composition in the vicinity of the phase boundary of pseudo-cubic system-tetragonal system-rhombohedral system, and particularly the composition of magnesium lead niobate of 15 to 50 mol %, lead zirconate of 10 to 45 mol % and lead titanate of 30 to 45 mol %, the composition of magnesium lead niobate of 15 to 50 mol %, nickel lead tantalate of 10 to 40 mol %, lead zirconate of 10 to 45 mol % and lead titanate of 30 to 45 mol %, and the composition of magnesium lead niobate of 15 to 50 mol %, magnesium lead tantalate of 10 to 40 mol %, lead zirconate of 10 to 45 mol % and lead titanate of 30 to 45 mol % are preferably adopted from the reason that they have a high piezoelectricity constant and a high electro-mechanical coupling coefficient.

What is claimed is:

1. An electron-emitting element comprising:

an electric field applying portion comprising a dielectric;

a first electrode formed on a surface of said electric field applying portion;

a second electrode formed on said surface of said electric field applying portion; and a slit formed in cooperation with said first electrode.

2. An electron-emitting element according to claim 1, further comprising a third electrode spaced a distance from said first and said second electrodes, wherein said space between said first and second electrodes and said third electrode comprises vacuum.

3. An electron-emitting element according to claim 2, further comprising:

a voltage source for applying a direct offset voltage to said third electrode; and a resistor arranged in series between said voltage source and said third electrode.

4. An electron-emitting element according to claim 1, wherein a pulse voltage is applied to said first electrode and a direct offset voltage is applied to said second electrode.

5. An electron-emitting element according to claim 1, further comprising a capacitor arranged in series between said first electrode and said voltage source.

6. An electron-emitting element according to claim 1, further comprising a fourth electrode formed on the other surface of said electric field applying portion and facing said first electrode.

7. An electron-emitting element according to claim 6, wherein a pulse voltage is applied to said fourth electrode and a direct offset voltage is applied to said second electrode.

8. An electron-emitting element according to claim 1, further comprising a resistor arranged in series between said second electrode and a direct offset voltage source.

9. An electron-emitting element according to claim 1, wherein said electric field applying portion has a relative dielectric constant of not less than 1000.

10. An electron-emitting element according to claim 1, wherein said slit has the width of not more than 500 μm.

11. An electron-emitting element according to claim 1, wherein at least one of said first electrode and said second electrode has an angular part with an acute angle.

12. An electron-emitting element according to claim 1, wherein said first electrode and said second electrode each have carbon nanotubes.

13. An electron-emitting element comprising:

an electric field applying portion comprising at least one of a piezoelectric material, an electrostrictive material and an antiferroelectric material;

a first electrode formed on a surface of said electric field applying portion;

a second electrode formed on said surface of said electric field applying portion; and a slit formed in cooperation with said first electrode.

14. An electron-emitting element according to claim 13, further comprising a third electrode spaced a distance from said first and said second electrodes, wherein said space between said first and second electrodes and said third electrode comprises vacuum.

15. An electron-emitting element according to claim 14, wherein said electric field applying portion also acts an actuator and controls a quantity of emitted electrons by a displacement motion of said electric field applying portion.

16. A field emission display comprising:

a plurality of electron-emitting elements arranged in two dimensions; and a plurality of phosphors each being arranged with a certain space to each of said electron-emitting elements;

wherein each of said electron-emitting elements comprising:

an electric field applying portion comprising a dielectric, a first electrode formed on a surface of said electric field applying portion, a second electrode formed on said surface of said electric field applying portion, and a slit formed in cooperation with said first electrode.

17. A field emission display according to claim 16, wherein a third electrode is arranged on a surface opposing a surface of each of said phosphors facing said first and second electrodes, wherein said space between said first and second electrodes and said phosphor comprises a vacuum.

18. A field emission display according to claim 17, wherein each of said electron-emitting elements comprises:

a voltage source for applying a direct offset voltage to said third electrode; and a resistor arranged in series between said voltage source and said third electrode.

19. A field emission display according to claim 16, wherein a pulse voltage is applied to said first electrode and a direct offset voltage is applied to said second electrode.

20. A field emission display according to claim 16, wherein each of said electron-emitting elements further comprises a capacitor arranged in series between said first electrode and said voltage signal source.

21. A field emission display according to claim 16, wherein each of said electron-emitting elements further comprises a fourth electrode being formed on the other surface of said electric field applying portion and opposing said first electrode.

22. A field emission display according to claim 21, wherein a pulse voltage is applied to said fourth electrode and a direct offset voltage is applied to said second electrode.

23. A field emission display according to claim 16, wherein each of said electron-emitting elements further comprises a resistor arranged in series between said second electrode and said direct offset voltage source.

24. A field emission display according to claim 16, wherein said electric field applying portion has a relative dielectric constant of not less than 1000.

25. A field emission display according to claim 16, wherein said slit has a width not more than 500 μm.

26. A field emission display according to claim 16, wherein at least one of said first electrode and said second electrode has an angular part with an acute angle.

27. A field emission display according to claim 16, wherein said first electrode and said second electrode each have carbon nanotubes.

28. A field emission display according to claim 16, further comprising a substrate having a plurality of electron-emitting elements arranged in two dimensions and formed into one body with each other.

29. A field emission display comprising:

a plurality of electron-emitting elements arranged in two dimensions; and a plurality of phosphors each being arranged with a certain space to each of said electron-emitting elements;

wherein each of said electron-emitting elements comprises:

an electric field applying portion comprising at least one of a piezoelectric material, an electrostrictive material and an antiferroelectric material;

a first electrode formed on a surface of said electric field applying portion, a second electrode formed on said surface of said electric field applying portion, and a slit formed in cooperation with said first electrode.

30. A field emission display according to claim 29, wherein a third electrode is arranged on the opposite surface to a surface of each of said phosphors facing said first and second electrodes, wherein said space between said first and second electrodes and said phosphor comprises a vacuum.

31. A field emission display according to claim 29, wherein said electric field applying portion also acts as an actuator and controls a quantity of emitted electrons by a displacement motion of said electric field applying portion.

* * * * *